(«12») United States Patent
Kodama et al.

(10) Patent No.: US 10,461,766 B2
(45) Date of Patent: Oct. 29, 2019

(54) SEMICONDUCTOR DEVICE, SIGNAL PROCESSING SYSTEM, AND SIGNAL PROCESSING METHOD

(71) Applicant: Renesas Electronics Corporation, Koutou-ku, Tokyo (JP)

(72) Inventors: Hiroto Kodama, Tokyo (JP); Masaki Kudo, Tokyo (JP); Takeshi Kusunoki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/022,190

(22) Filed: Jun. 28, 2018

(65) Prior Publication Data
US 2019/0068211 A1    Feb. 28, 2019

(30) Foreign Application Priority Data

Aug. 30, 2017   (JP) .................................. 2017-165091

(51) Int. Cl.
*H03M 1/18* (2006.01)
*H03M 1/10* (2006.01)

(52) U.S. Cl.
CPC .......... *H03M 1/183* (2013.01); *H03M 1/1028* (2013.01)

(58) Field of Classification Search
CPC ...... H03M 1/183; H03M 1/1028; G05F 1/565
USPC ................................................. 341/120–155
See application file for complete search history.

(56) References Cited

U.S. PATENT DOCUMENTS

| | | | | |
|---|---|---|---|---|
| 5,499,190 A | * | 3/1996 | Takahashi | G01R 13/347 324/621 |
| 6,006,996 A | * | 12/1999 | Bhatnagar | G05D 23/1934 236/46 R |
| 8,064,300 B2 | * | 11/2011 | Abe | G11B 7/0945 369/44.35 |
| 8,077,065 B2 | | 12/2011 | Iso et al. | |
| 2006/0082351 A1 | * | 4/2006 | Martins | H02J 9/005 323/268 |

(Continued)

FOREIGN PATENT DOCUMENTS

| | | |
|---|---|---|
| EP | 2 759 900 A1 | 7/2014 |
| JP | 2010-259035 A | 11/2010 |
| WO | WO 2014/185949 A1 | 11/2014 |

OTHER PUBLICATIONS

Extended European Search Report dated Jan. 31, 2019, in European Patent Application No. 18182918.5.

*Primary Examiner* — Lam T Mai
(74) *Attorney, Agent, or Firm* — Shapiro, Gabor and Rosenberger, PLLC

(57) ABSTRACT

A semiconductor device, a signal processing system, and a signal processing method are provided that regulate a change of characteristics in the event of aged deterioration. The semiconductor device of the present invention includes a reference voltage generation circuit that generates a reference voltage, an analog signal processing circuit that outputs a first processing signal according to the reference voltage, a test signal output section that outputs, as a test signal, a second processing signal having a lower voltage than the first processing signal, an input section that receives a regulation signal for the outputted test signal, and a regulator circuit that regulates the output of the analog signal processing circuit in response to the regulation signal.

18 Claims, 9 Drawing Sheets

(56) References Cited

U.S. PATENT DOCUMENTS

| | | | |
|---|---|---|---|
| 2006/0165186 A1* | 7/2006 | Segaram | H04L 7/0337 375/257 |
| 2007/0046271 A1 | 3/2007 | Zolfaghari | |
| 2012/0139765 A1* | 6/2012 | Tseng | H03M 1/1028 341/118 |
| 2013/0162227 A1 | 6/2013 | Kodama et al. | |

* cited by examiner

FIG. 5

SEMICONDUCTOR DEVICE, SIGNAL PROCESSING SYSTEM, AND SIGNAL PROCESSING METHOD

CROSS-REFERENCE TO RELATED APPLICATIONS

The disclosure of Japanese Patent Application No. 2017-165091 filed on Aug. 30, 2017 including the specification, drawings and abstract is incorporated herein by reference in its entirety.

BACKGROUND

The present invention relates to a semiconductor device, a signal processing system, and a signal processing method and relates to, for example, a technique of regulating a change of characteristics in the event of aged deterioration.

The characteristics of a semiconductor device are changed by, for example, aged deterioration of the gate oxide film of a transistor included in the semiconductor device. Thus, techniques have been developed to ensure that a semiconductor device outputs a voltage within a design range even after a change of the characteristics.

Japanese Unexamined Patent Application Publication No. 2010-259035 describes a technique of ensuring data continuity when a measured voltage is AD-converted through amplification by an amplifier and when the measured value is directly converted without an amplifier.

SUMMARY

However, using the technique described in Japanese Unexamined Patent Application Publication No. 2010-259035 may be affected by circuits arranged in a semiconductor device. Specifically, in the presence of a circuit that receives a larger current than an arithmetic circuit in a control circuit and a switching circuit having a predetermined frequency, the noise of the ground and a power supply may increase, making it difficult to properly drive a high-precision regulator circuit.

Other problems and new features will be clarified by the description and the accompanying drawings of the present specification.

According to an embodiment, a semiconductor device includes:

a reference voltage generation circuit that generates a reference voltage;

an analog signal processing circuit that outputs a first processing signal according to the reference voltage;

a test signal output section that outputs, as a test signal, a second processing signal having a lower voltage than the first processing signal;

an input section that receives a regulation signal for the outputted test signal, and a regulator circuit that regulates the output of the analog signal processing circuit in response to the regulation signal.

According to an embodiment, a signal processing system including: a first semiconductor device including a reference voltage generation circuit that generates a reference voltage; an analog signal processing circuit that outputs a first processing signal according to the reference voltage; a test signal output section that outputs, as a test signal, a second processing signal having a lower voltage than the first processing signal; an input section that receives a regulation signal for the outputted test signal; and a regulator circuit that regulates the output of the analog signal processing circuit in response to the regulation signal, and a second semiconductor device including an AD converter circuit that converts, into a digital signal, the test signal outputted from the first semiconductor device and then outputs the digital signal, and a test circuit that compares the digital signal and a stored expected value and then outputs the regulation signal according to a difference value obtained as a comparison result.

According to an embodiment, a signal processing method including the steps of:

generating a reference voltage by a first semiconductor device;

outputting a first processing signal as the output of an analog signal processing circuit according to the reference voltage by the first semiconductor device;

outputting a second processing signal having a lower voltage than the first processing signal, as a test signal by the first semiconductor device;

converting the test signal into a digital signal and then outputting the digital signal by a second semiconductor device;

comparing the digital signal and a stored expected value by the second semiconductor device and then outputting a regulation signal by the second semiconductor device according to a difference value obtained as a comparison result;

receiving the regulation signal by the first semiconductor device, and regulating the output of the analog signal processing circuit by the first semiconductor device in response to the regulation signal.

According to the embodiment, a semiconductor device, a signal processing system, and a signal processing method can be provided that regulate a change of characteristics in the event of aged deterioration.

BRIEF DESCRIPTION OF THE DRAWINGS

FIG. 5 is a block diagram showing a modification of the signal processing system according to the second embodiment;

DETAILED DESCRIPTION

Figure 1:
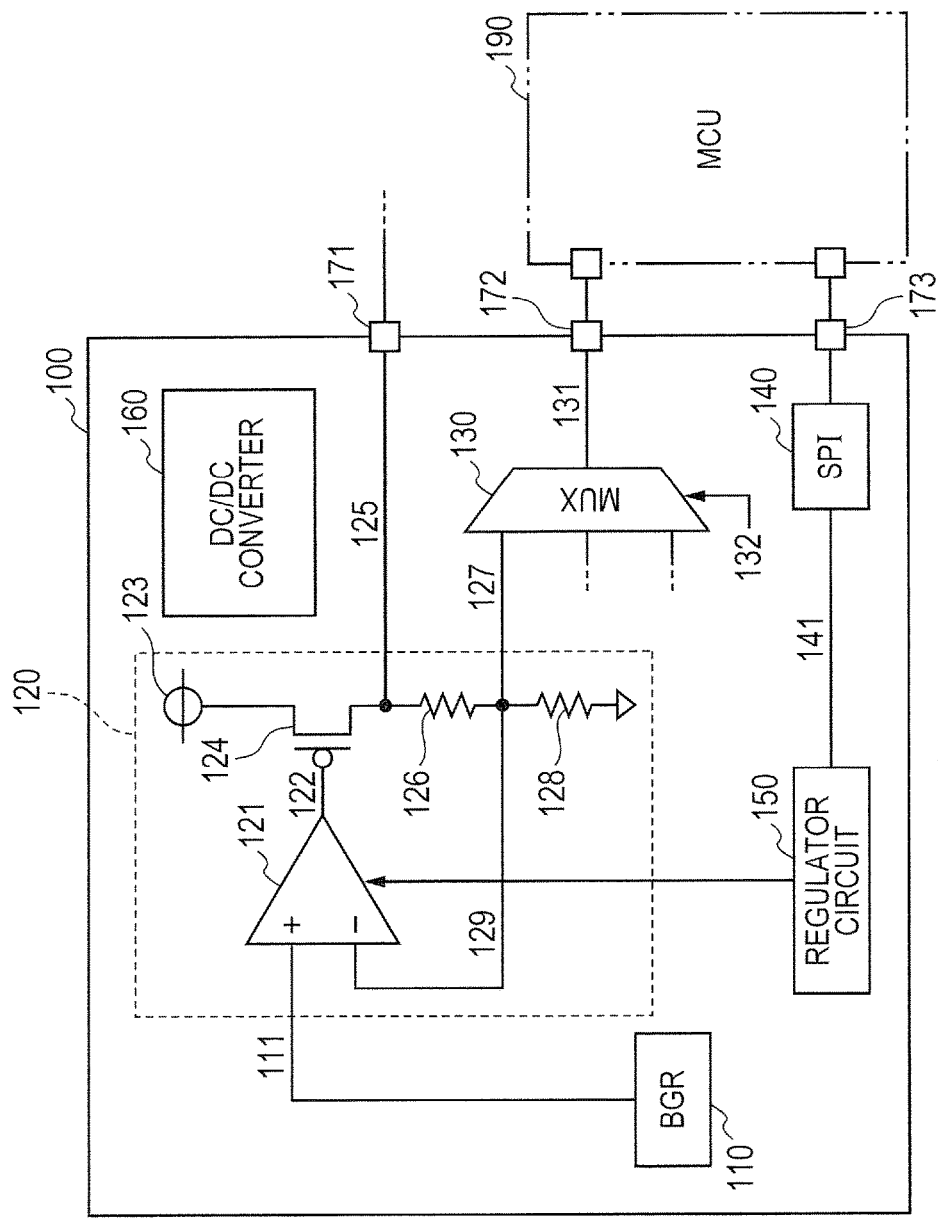
FIG. 1 is a block diagram showing a semiconductor device according to a first embodiment.

Embodiments will be described below with reference to the accompanying drawings. The drawings are schematically illustrated and thus the technical scope of the embodiments should not be narrowly interpreted in accordance with the drawings. The same elements are indicated by the same reference numerals and the redundant explanation is omitted.

For the convenience of explanation, a plurality of sections or the embodiments will be separately described in the following embodiments. The sections or embodiments are relevant to one another unless otherwise specified. One of the sections or embodiments is, for example, a modification, an application, a detailed explanation, and a supplementary explanation of some or all of the other sections or embodiments. In the following embodiments, the number of elements (including a number, a numeric value, an amount, and a range) is not limited to a specific number unless otherwise specified or clearly limited to the specific number in theory. Thus, the number of elements may be larger or smaller than the specific number.

Furthermore, the constituent elements (including operation steps) of the following embodiments are not always necessary unless otherwise specified and clearly required in theory. Similarly, the shapes and positional relationships of the constituent elements in the following embodiments substantially include close or similar shapes of the constituent elements unless otherwise specified or clearly excluded in theory. This also holds true for the number of elements (including a number, a numeric value, an amount, and a range).

For clarification of the explanation, the following description and drawings are optionally omitted and simplified. Moreover, elements illustrated as functional blocks for various processing in the drawings can be configured with hardware including a CPU, memory, and other circuits and software including programs loaded in memory. Thus, a person skilled in the art could understand that these functional blocks can be implemented in various forms, for example, by hardware alone, software alone, or a combination of hardware and software. The forms of the functional blocks are not particularly limited. The same elements are indicated by the same reference numerals in the drawings and the redundant explanation is optionally omitted.

First Embodiment

Figure 2:
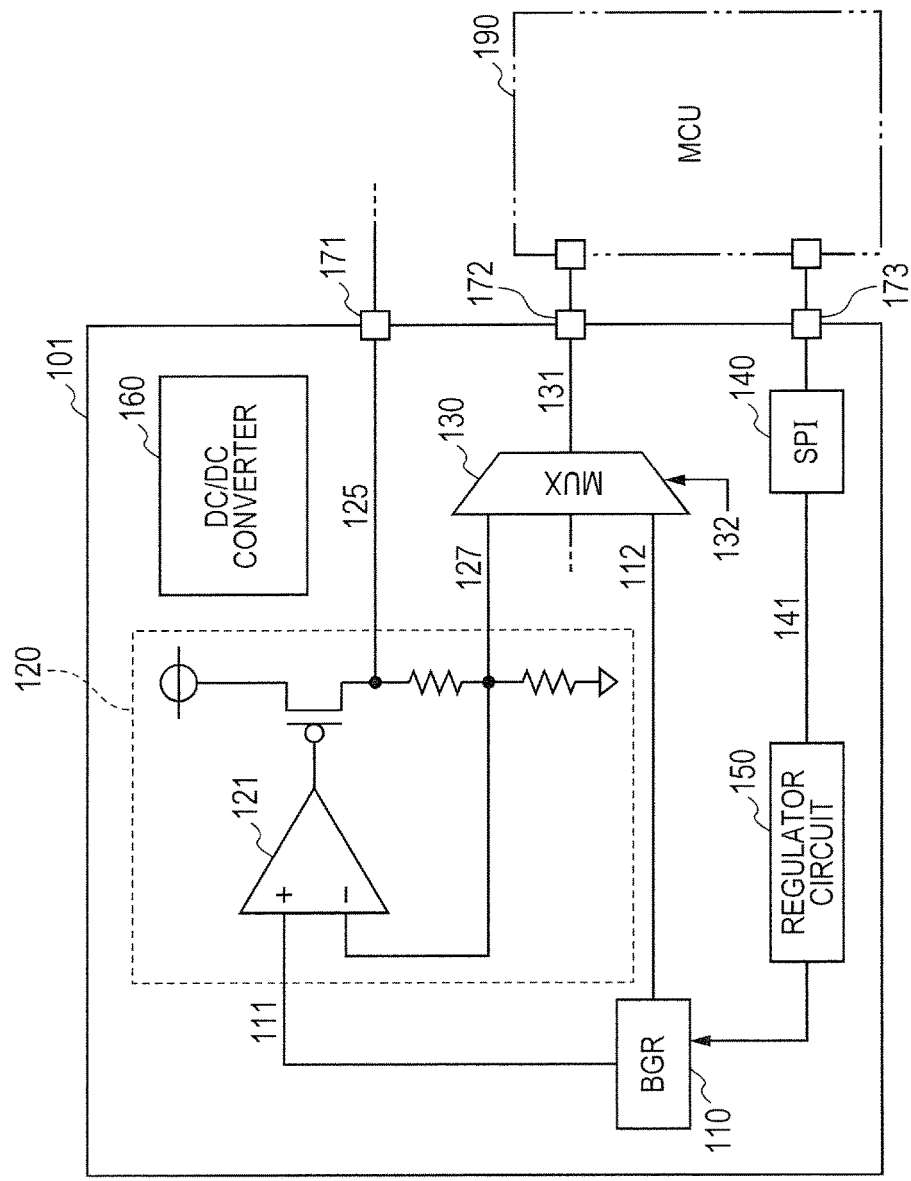
FIG. 2 is a block diagram showing a first modification of the semiconductor device according to the first embodiment.
Figure 3:
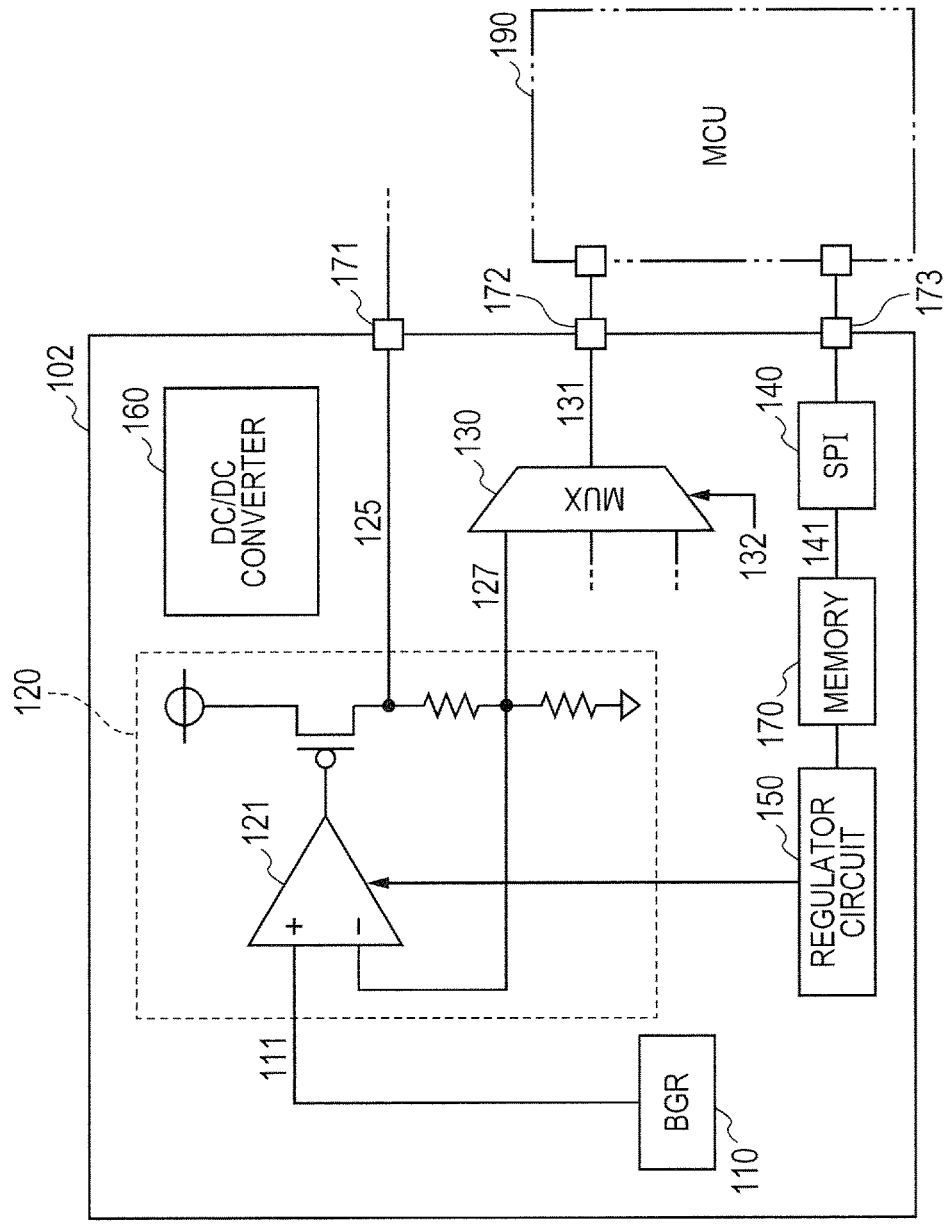
FIG. 3 is a block diagram showing a second modification of the semiconductor device according to the first embodiment.

Referring to FIGS. 1 to 3, a first embodiment will be described below. First, a semiconductor device illustrated in FIG. 1 will be discussed below. FIG. 1 is a block diagram showing the semiconductor device according to the first embodiment. A semiconductor device 100 includes a circuit for mainly processing an analog signal. Examples of the semiconductor device 100 include a power management unit (PMU). If the output voltage of an analog signal processing circuit is changed by aged deterioration, the semiconductor device 100 can continuously regulate the output voltage within a predetermined range. The semiconductor device 100 is a semiconductor chip.

The semiconductor device 100 is coupled to a micro controller unit (MCU) 190. The semiconductor device 100 outputs a test signal to the MCU 190. The MCU 190 receives the test signal and generates a regulation signal for regulating the output voltage of an analog signal processing circuit, based on the received test signal. Then, the MCU 190 outputs the generated regulation signal to the semiconductor device 100. The semiconductor device 100 receives the regulation signal outputted from the CU 190 and regulates the output voltage of the analog signal processing circuit.

The detail of the configurations of the semiconductor device 100 will be described below. The semiconductor device 100 mainly includes a reference voltage generation circuit 110, an analog signal processing circuit 120, a multiplexer 130, a serial peripheral interface (SPI) communication section 140, a regulator circuit 150, and a DC (direct current)/DC converter 160. The semiconductor device 100 further includes an amplified signal output port 171 for outputting voltage from the analog signal processing circuit 120 to the outside, a test signal output port 172 for outputting a signal from the multiplexer 130 to the outside, and a communication port 173 for receiving the regulation signal from the outside.

The reference voltage generation circuit 110 generates the reference voltage and outputs the voltage to the analog signal processing circuit 120 in the semiconductor device 100. The reference voltage generation circuit 110 will be also referred to as a band-gap reference (BGR).

The analog signal processing circuit 120 will be described below. The analog signal processing circuit 120 is a regulator that outputs a constant voltage. The analog signal processing circuit 120 mainly includes an amplifier 121, a transistor 124, a first resistor 126, and a second resistor 128. The amplifier 121 is coupled to the reference voltage generation circuit 110 and receives the reference voltage as a noninverting input signal 111. The amplifier 121 outputs an amplified signal 122 generated by amplifying a difference between the noninverting input signal 111 and an inverting input signal 129. The transistor 124 receives, as a gate input, the amplified signal 122 outputted from the amplifier 121. The transistor 124 reduces the voltage of a power supply 123 according to the voltage of the amplified signal 122 serving as the gate input, and then the transistor 124 outputs a first processing signal 125. In other words, the first processing signal is an analog signal outputted from the analog signal processing circuit 120.

The first resistor 126 is coupled to the transistor 124 and outputs the inverting input signal 129. The amplifier 121 outputs the amplified signal 122 based on a difference between the noninverting input signal 111 and the inverting input signal 129.

The second resistor 128 is provided between the first resistor 126 and the ground. The analog signal processing circuit 120 outputs a second processing signal 127 from the node between the first resistor 126 and the second resistor 128. The second processing signal 127 is set at a lower voltage than the first processing signal 125 by the first resistor 126 and the second resistor 128.

The analog signal processing circuit 120 includes multiple transistors and resistors. The characteristics of the transistors and resistors in the analog signal processing circuit 120 may be changed by aged deterioration. If a difference value is incorrect between the noninverting input signal 111 and the inverting input signal 129, the value of the first processing signal 125 may deviate from a design value. Thus, the analog signal processing circuit 120 of the first embodiment is coupled to the regulator circuit 150.

The analog signal processing circuit 120 may be an ordinary linear regulator or a low drop-out linear regulator (LDO). The analog signal processing circuit 120 may be replaced with multiple circuits in the semiconductor device 100. If the multiple analog signal processing circuits 120 are provided in the semiconductor device 100, each of the analog signal processing circuits 120 may output the first processing signal 125 and the second processing signal 127 at different voltages.

The multiplexer 130 will be described below. The multiplexer 130 has a plurality of input terminals and outputs, as the test signal, a signal selected from multiple input signals. The multiplexer 130 receives, as an input signal, the second processing signal 127 outputted from the analog signal processing circuit 120. Moreover, the multiplexer 130 receives a selection signal 132 from a control unit (not shown). Then, the multiplexer 130 selects one of the input signals in response to the received selection signal 132 and outputs the selected signal as a test signal 131. The test signal 131 outputted from the multiplexer 130 is outputted to the outside of the semiconductor device 100 through the test signal output port 172.

If the semiconductor device 100 includes the multiple signal processing circuits 120, the multiplexer 130 can receive input signals from the signal processing circuits 120. In this case, the control unit (not shown) can determine which one of the input signals from the signal processing circuits 120 is to be outputted as the test signal 131. Furthermore, the control unit (not shown) may instruct the multiplexer 130 to output the test signal 131 after a lapse of a predetermined time. Alternatively, the control unit (not shown) may receive an instruction to output the test signal 131 and then instruct the multiplexer 130 to output the test signal 131 in response to the instruction.

The SPI communication section 140 is an interface for communicating with the outside of the semiconductor device 100. Specifically, the SPI communication section 140 can transmit and receive signals to and from external semiconductor devices through the communication port 173. The SPI communication section 140 receives a signal from the outside through the communication port 173 and outputs the signal into the semiconductor device 100. More specifically, the SPI communication section 140 receives a regulation signal 141 from the outside in response to the test signal 131. Then, the SPI communication section 140 outputs the received regulation signal 141 to the regulator circuit 150.

The regulator circuit 150 receives the regulation signal 141 outputted from the SPI communication section 140. Thereafter, the regulator circuit 150 regulates the amplified signal 122 in the analog signal processing circuit 120 in response to the regulation signal 141 received from the SPI communication section 140.

The regulator circuit 150 will be described below in accordance with a specific example. The example of the regulator circuit 150 is a circuit including multiple resistors and multiple switch circuits. In this case, the regulation signal 141 determines which one of the switch circuits is to be coupled and which one of the switch circuits is to be uncoupled. With this configuration, the regulator circuit 150 changes a resistance value therein. Moreover, the regulator circuit 150 is coupled to the inverting input signal 129 of the amplifier 121. This allows the regulator circuit 150 to regulate the voltage of the inverting input signal 129 according to a change of the resistance value. Hence, the regulator circuit 150 can regulate the amplified signal 122 serving as the output of the amplifier 121. The first processing signal 125 and the second processing signal 127 are regulated according to the value of the amplified signal 122. The configuration of the regulator circuit 150 is merely exemplary. Any configuration may be used as long as the first processing signal 125 and the second processing signal 127 are regulated.

The DC/DC converter 160 is a circuit mounted with the above-mentioned constituent elements in the semiconductor device 100. The DC/DC converter 160 is, for example, a switching regulator or a series regulator of an ordinary technique. The DC/DC converter 160 can receive a predetermined current or generate noise in response to a predetermined switching operation.

The test signal output port 172 outputs the test signal 131 outputted from the multiplexer 130, to the outside of the semiconductor device 100. In the first embodiment, the test signal output port 172 is coupled to the micro controller unit (MCU) 190. In other words, the test signal output port 172 outputs the test signal 131 to the MCU 190.

The communication port 173 is coupled to the MCU 190. The communication port 173 receives the regulation signal 141 outputted from the MCU 190 and outputs the signal to the SPI communication section 140.

The SPI communication section 140 may meet any communication specifications other than SPI communications as long as the SPI communication section 140 is an interface for communicating with the outside. For example, the SPI communication section 140 may meet the communication specifications of serial communications for, for example, inter-integrated circuits (I2Cs) or universal asynchronous receivers/transmitters (UARTs). Alternatively, the SPI communication section 140 may meet the communication specifications of parallel communications.

The MCU 190 receives the test signal 131 outputted from the semiconductor device 100 and compares the test signal 131 and an expected value that is stored in advance. Thereafter, the MCU 190 generates the regulation signal 141 according to the comparison result. The MCU 190 then outputs the generated regulation signal 141 to the communication port 173. If the semiconductor device 100 includes the multiple signal processing circuits 120, the expected values of the respective signal processing circuits 120 are stored in advance in the MCU 190. In this case, the MCU 190 also receives, from the semiconductor device 100, information for identifying the signal processing circuit 120 from which the received test signal 131 is inputted.

With this configuration, the semiconductor device 100 of the first embodiment outputs the test signal 131 to the outside in order to generate the regulation signal 141, and receives the regulation signal 141 from the outside in order to regulate the first processing signal outputted from the analog signal processing circuit 120. Thus, the semiconductor device 100 of the first embodiment suppresses the influence of noise generated by the internal circuit of the semiconductor device 100 and regulates a change of characteristics in the event of aged deterioration of the analog signal processing circuit 120.

Moreover, the semiconductor device 100 of the first embodiment suppresses the influence of noise generated by the DC/DC converter 160 and regulates a change of characteristics in the event of aged deterioration of the analog signal processing circuit 120. This configuration is also applicable if the semiconductor device 100 includes a motor driver, an oscillator, and a charge pump as well as the DC/DC converter. In other words, the configuration of the present embodiment is applicable if the internal circuit of the semiconductor device 100 generates noise.

First Modification of the First Embodiment

Referring to FIG. 2, a first modification will be described below according to the first embodiment. FIG. 2 is a block diagram showing the first modification of the semiconductor device according to the first embodiment. A semiconductor device 101 in FIG. 2 is different from the semiconductor device 100 in FIG. 1 in that the reference voltage generation circuit 110 is also coupled to the multiplexer 130 and the regulator circuit 150 is coupled to the reference voltage generation circuit 110 instead of the amplifier 121. Other configurations are similar to those of the semiconductor device 100 shown in FIG. 1.

In FIG. 2, the reference voltage generation circuit 110 generates the reference voltage and outputs the voltage to the analog signal processing circuit 120, and further outputs a reference voltage 112 to the multiplexer 130. The multiplexer 130 receives the reference voltage 112 outputted from the reference voltage generation circuit 110.

The multiplexer 130 receives a plurality of input signals. The input signals received by the multiplexer 130 include the second processing signal 127 outputted from the analog signal processing circuit 120 and the reference voltage 112 outputted from the reference voltage generation circuit 110. Moreover, the multiplexer 130 receives the selection signal 132 from the control unit (not shown). Then, the multiplexer 130 selects one of the input signals in response to the received selection signal 132 and outputs the selected signal as the test signal 131.

The input signal is to be selected as the test signal 131 can be optionally determined. For example, the control unit (not shown) may output the selection signal 132 so as to instruct the multiplexer 130 to alternately output the second processing signal 127 and the reference voltage 112 at each predetermined time. Alternatively, in response to an instruction from the MCU, the control unit (not shown) may determine which one of the input signals is to be selected as the test signal 131. If the multiple analog signal processing circuits 120 are provided in the semiconductor device 101, the control unit (not shown) can optionally select the test signal 131 from the second processing signals and the reference voltage 112.

The MCU 190 optionally receives the test signal 131 from the test signal output port 172. If the MCU 190 receives the reference voltage 112 from the semiconductor device 101, the MCU 190 compares the test signal 131 and a predetermined expected value. The MCU 190 compares the reference voltage 112 received as the test signal 131 and a predetermined expected value and outputs the regulation signal to the communication port 173 according to a difference value.

The regulator circuit 150 receives the regulation signal 141 outputted from the SPI communication section 140. Then, the regulator circuit 150 regulates the reference voltage outputted from the reference voltage generation circuit 110, in response to the received regulation signal 141.

An example of the principle of regulation of the reference voltage by the regulator circuit 150 will be described below. The reference voltage generation circuit 110 may include a combination of an amplifier, a transistor, and a resistor. The regulator circuit 150 includes, for example, a part of the resistor of the reference voltage generation circuit 110. An example of the regulator circuit 150 is a circuit including a plurality of resistors and a plurality of switch circuits. The regulation signal can determine which one of the switch circuits is to be coupled and which one of the switch circuits is to be uncoupled. With this configuration, the regulator circuit 150 can change a resistance value therein. This allows the regulator circuit 150 to regulate the reference voltage according to a change of the resistance value. The configuration of the regulator circuit 150 is merely exemplary. Any other configuration may be used as long as the reference voltage is regulated.

With this configuration, the semiconductor device 101 outputs the test signal 131 to the outside in order to generate the regulation signal 141, and receives the regulation signal 141 from the outside in order to regulate the reference voltage. Thus, the semiconductor device 101 suppresses the influence of noise generated by the internal circuit of the semiconductor device 101 and regulates a change of characteristics in the event of aged deterioration of the analog signal processing circuit 120.

The semiconductor device 101 in FIG. 2 includes the single analog signal processing circuit 120. Obviously, the semiconductor device 101 may include the multiple analog signal processing circuits 120. In this case, the reference voltage generation circuit 110 may be coupled to the analog signal processing circuits. In such a case, the outputs of the analog signal processing circuits can be simultaneously regulated by regulating the reference voltage outputted from the reference voltage generation circuit 110.

Second Modification of the First Embodiment

Referring to FIG. 3, a second modification will be described below according to the first embodiment. FIG. 3 is a block diagram showing the second modification of the semiconductor device according to the first embodiment. A semiconductor device 102 in FIG. 3 is different from the semiconductor device 100 in FIG. 1 in that a memory 170 is arranged between the SPI communication section 140 and the regulator circuit 150. Other configurations are similar to those of the semiconductor device 100 shown in FIG. 1.

The memory 170 stores the regulation signal 141 outputted from the SPI communication section 140. The memory 170 is a rewritable and nonvolatile memory section that includes, for example, flash memory, electrically erasable programmable read-only memory (EEPROM), and magnetic random access memory (MRAM). Since the memory 170 is a nonvolatile memory section, the regulation signal 141 can be stored even after the semiconductor device 100 stops the system. Thus, if the system is stopped and restarted, the regulator circuit 150 reads the regulation signal 141 stored in the memory 170. Then, the regulator circuit 150 regulates the amplifier 121 in response to the read regulation signal 141.

With this configuration, the semiconductor device 102 can regulate the analog signal processing circuit 120 in response to the stored regulation signal at the start of the system. Thus, the system can be started in a short time. Thereafter, the semiconductor device 102 suppresses the influence of noise generated by the internal circuit of the semiconductor device 102 and regulates a change of characteristics in the event of aged deterioration of the analog signal processing circuit 120.

In the first semiconductor device 102, the regulator circuit 150 is coupled to the analog signal processing circuit 120. The regulator circuit 150 may be coupled to the reference voltage generation circuit 110 and regulate the reference voltage. In this case, the semiconductor device 102 can simultaneously regulate the outputs of the analog signal processing circuits by regulating, in response to the stored regulation signal, the reference voltage outputted from the reference voltage generation circuit 110.

Second Embodiment

Figure 4:
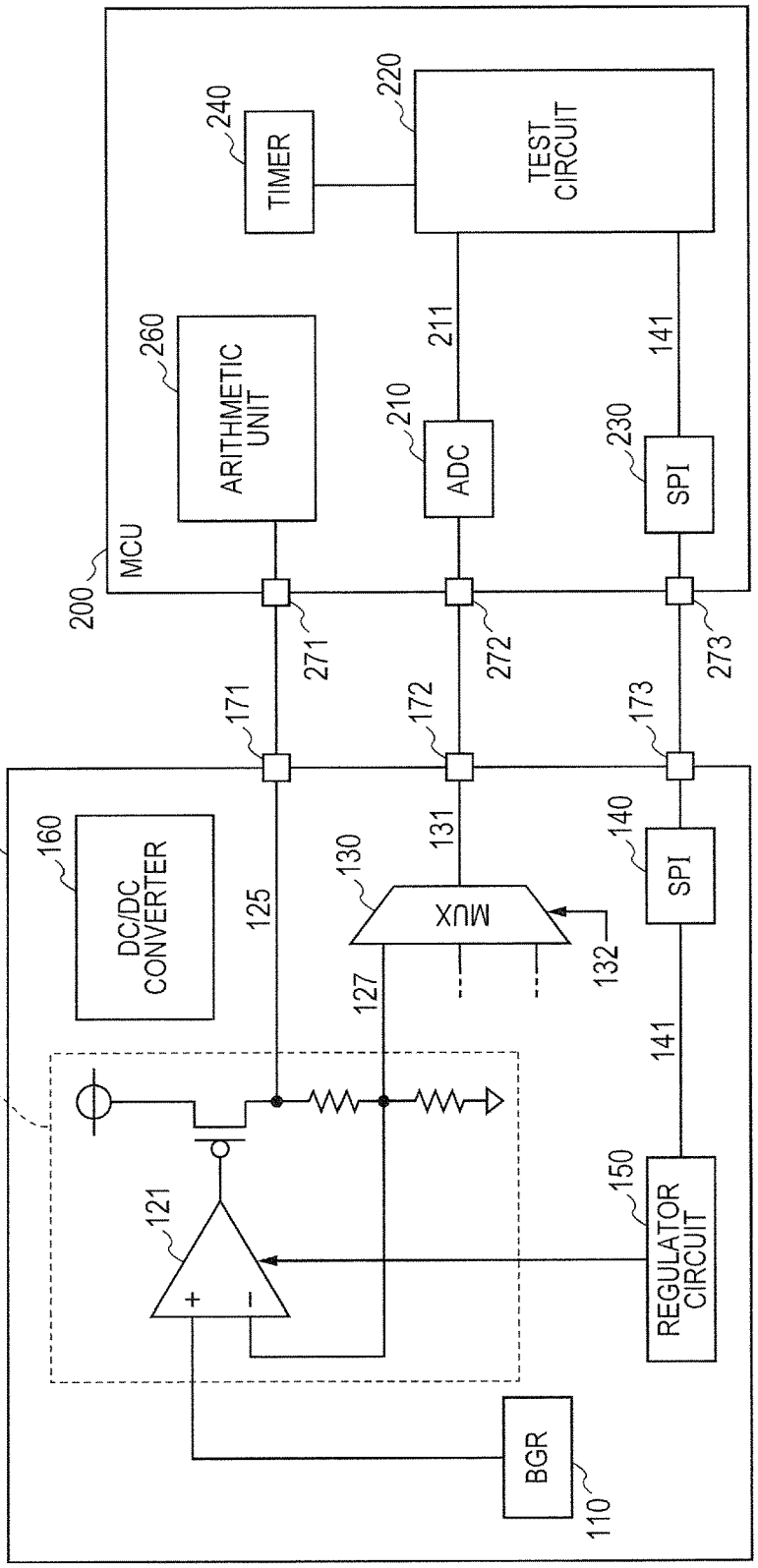
FIG. 4 is a block diagram showing a signal processing system according to a second embodiment.

Referring to FIG. 4, a second embodiment will be described below. FIG. 4 is a block diagram showing a signal processing system according to the second embodiment. A signal processing system 300 in FIG. 4 includes a first semiconductor device 100 and a second semiconductor device 200. The first semiconductor device 100 is identical in configuration to the semiconductor device 100 shown in the first embodiment. Thus, the explanation of the configuration of the first semiconductor device 100 is omitted.

The second semiconductor device 200 is, for example, an MCU for mainly processing a digital signal. The second semiconductor device 200 mainly includes an analog-to-digital (AD) converter circuit 210, a test circuit 220, an SPI communication section 230, a timer 240, and an arithmetic unit 260. The second semiconductor device 200 further includes an amplified-signal input port 271, a test-signal input port 272, and a communication port 273 as interfaces for coupling with the first semiconductor device 100. The first semiconductor device 100 and the second semiconductor device 200 are semiconductor chips, each being mounted on a board and coupled via lead wires provided on the board.

In the signal processing system described in the second embodiment, the first semiconductor device and the second semiconductor device are, for example, single-chip integrated circuits mounted on the board. However, the signal processing system is not limited to this configuration. For example, each of the first semiconductor device and the second semiconductor device mounted as single-chip integrated circuits may be laminated into a system on a chip (SoC) or a multilayer integrated circuit. Alternatively, in the signal processing system, each of the first semiconductor device 100 and the second semiconductor device 200 mounted as single-chip integrated circuits may be a hybrid integrated circuit (IC) mounted on the board.

The AD converter circuit 210 is an AD converter (ADC: analog to digital converter) that converts an analog signal to a digital signal. The AD converter circuit 210 converts (AD conversion) a test signal 131, which is an analog signal received from the test-signal input port 272, to a digital signal 211. The AD converter circuit 210 outputs the converted digital signal 211 to the test circuit 220.

The test circuit 220 compares the inputted digital signal 211 and a stored expected value and calculates a difference value as a comparison result. The test circuit 220 is, for example, a built-in self-test (BIST) circuit that includes at least a circuit for comparing the digital signal 211 and the expected value. Moreover, the test circuit 220 generates a regulation signal 141 for regulating the output of the analog signal processing circuit 120 according to the comparison result.

Specifically, the test circuit 220 receives the digital signal 211 outputted from the AD converter circuit 210. The test circuit 220 compares the received digital signal 211 and the expected value. The expected value is stored in advance in a memory section (not shown). The test circuit 220 calculates a difference value between the digital signal 211 and the expected value. Furthermore, the test circuit 220 decides whether or not the calculated difference value is larger than a predetermined value. If it is decided that the difference value is larger than the predetermined value, the test circuit 220 generates the regulation signal 141 corresponding to the difference value. The test circuit 220 outputs the regulation signal 141 corresponding to the difference value, to the SPI communication section 230.

If the first semiconductor device 100 includes the multiple signal processing circuits 120, the expected values of the respective signal processing circuits 120 are stored in advance in the second semiconductor device 200. In this case, the first semiconductor device 100 and the second semiconductor device 200 share information for identifying the signal processing circuit 120 from which the test signal 131 is inputted. The test circuit 220 compares the test signal 131 received by the second semiconductor device 200 and the expected values stored in the second semiconductor device 200.

The test circuit 220 may include an instruction section for an instruction to generate the test signal. The instruction section for an instruction to generate the test signal may monitor the timer 240 and instruct the first semiconductor device 100 to output the test signal after a lapse of a predetermined time.

The SPI communication section 230 is an interface for communicating with the outside of the second semiconductor device 200. In the present embodiment, the SPI communication section 230 communicates with the first semiconductor device 100. In other words, the SPI communication section 230 can transmit and receive signals to and from the first semiconductor device 100 through the communication port 273. Specifically, the SPI communication section 230 receives the regulation signal 141 outputted from the test circuit 220. The SPI communication section 230 then outputs the received regulation signal 141 to the first semiconductor device 100 through the communication port 273.

The timer 240 has the function of indicating the lapse of the predetermined time. For example, the timer 240 includes a real-time clock. The timer 240 can be monitored by the test circuit 220. Alternatively, the timer 240 can be monitored by a control unit (not shown). The timer 240 may notify the test circuit 220 or the control unit (not shown) of the lapse of the predetermined time.

The SPI communication section 230 may meet any communication specifications other than SPI communications as long as the SPI communication section 230 is an interface for communicating with the outside. For example, the SPI communication section 230 may meet the communication specifications of serial communications for, for example, inter-integrated circuits (I2Cs) or universal asynchronous receivers/transmitters (UARTs). Alternatively, the SPI communication section 230 may meet the communication specifications of parallel communications.

The arithmetic unit 260 is an arithmetic circuit mounted in the second semiconductor device 200. The arithmetic unit 260 receives a first processing signal 125 through the amplified-signal input port 271. Moreover, in the arithmetic unit 260, the received first processing signal 125 can be used as a power supply.

With this configuration, the first semiconductor device 100 outputs the test signal 131 to the second semiconductor device 200. Then, the second semiconductor device 200 outputs the regulation signal 141 for regulating the analog signal processing circuit 120 to the first semiconductor device 100. The first semiconductor device regulates the value of the first processing signal 125, which is the output of the analog signal processing circuit 120, in response to the regulation signal 141 received from the second semiconductor device 200. Thus, the signal processing system 300 suppresses the influence of noise generated by the internal circuit of the semiconductor device 100 and regulates a change of characteristics in the event of aged deterioration of the analog signal processing circuit 120.

Modification of the Second Embodiment

Figure 5:
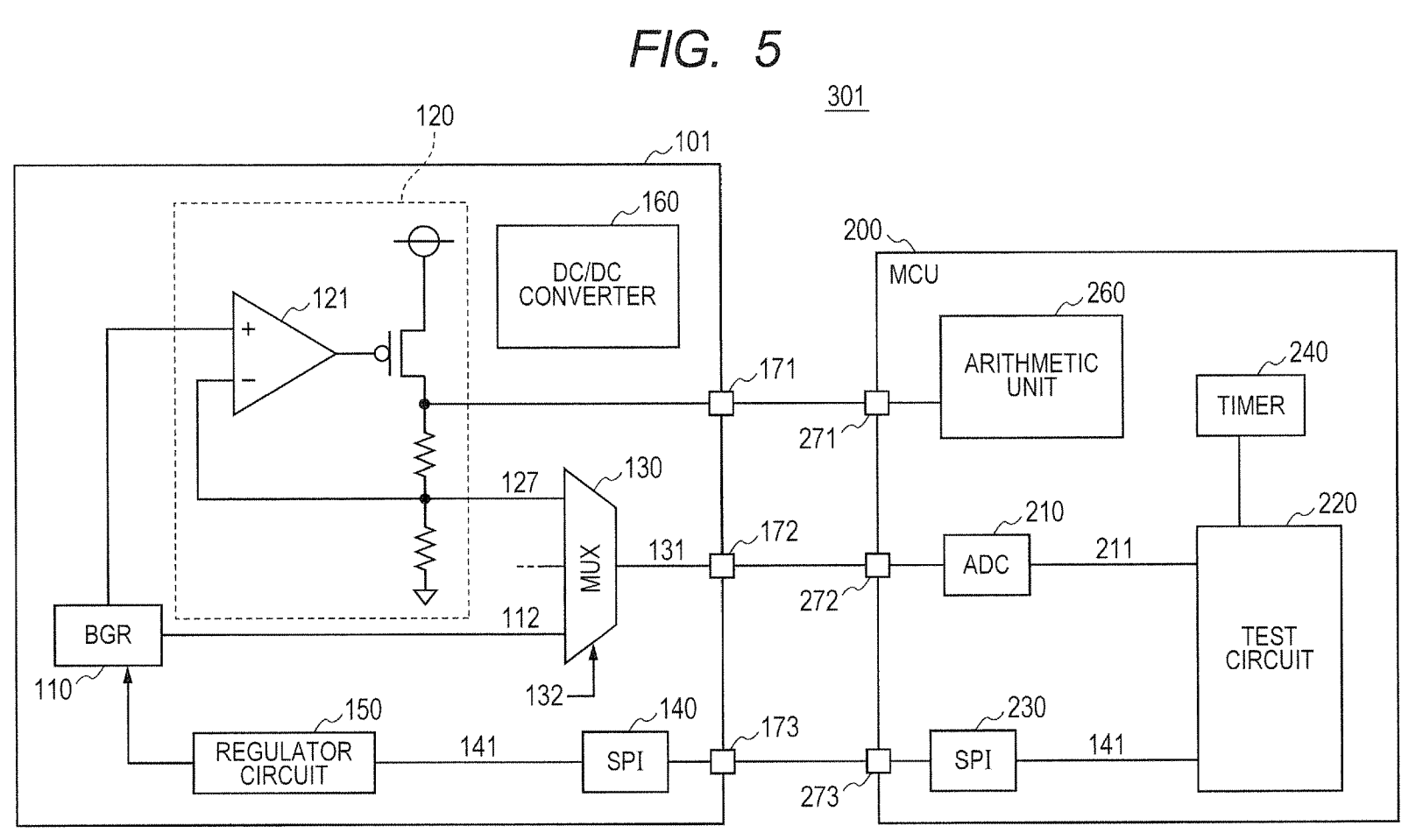

Referring to FIG. 5, a modification of the second embodiment will be described below. FIG. 5 is a block diagram showing the modification of the signal processing system according to the second embodiment. A signal processing system 301 in FIG. 5 is different from the semiconductor device 300 in FIG. 4 in that a first semiconductor device 101 is provided instead of the first semiconductor device 100. The first semiconductor device 101 is identical in configuration to the first modification illustrated with reference to FIG. 2 according to the first embodiment.

In the configuration of FIG. 5, the first semiconductor device 101 outputs the test signal 131 to the second semiconductor device 200. Then, the second semiconductor device 200 can output the regulation signal 141 for regulating a reference voltage to the first semiconductor device 101. The first semiconductor device 101 regulates the reference voltage in response to the regulation signal 141 received from the second semiconductor device 200. Thus, the signal processing system 301 suppresses the influence of noise generated by the internal circuit of the semiconductor device 101 and regulates a change of characteristics in the event of aged deterioration of the analog signal processing circuit 120.

The configurations of the first semiconductor device 100 according to the second embodiment and the first semiconductor device 101 according to the modification of the second embodiment are not mutually exclusive and may overlap each other. Specifically, in the first semiconductor device 100, the reference voltage outputted from the reference voltage generation circuit 110 may be inputted to the multiplexer 130. Similarly, in the first semiconductor device 101, the regulator circuit 150 may be coupled to the signal processing circuit 120 and regulate the signal processing circuit 120. Moreover, the first semiconductor device 100 or the first signal processing circuit 101 may include a plurality of regulator circuits and selectively regulate the reference voltage generation circuit 110 and the signal processing circuit 120.

Moreover, if the reference voltage generation circuit 110 and the signal processing circuit 120 can be selectively regulated, the reference voltage generation circuit 110 is preferably regulated with priority. The reference voltage generation circuit 110 is preferably regulated with priority for the following reason: generally, if the first semiconductor device 100 or the first semiconductor device 101 includes the multiple signal processing circuits 120, the reference voltage generation circuit 110 is coupled to the signal processing circuits 120. In this case, the outputs of the signal processing circuits 120 are regulated by regulating the reference voltage generation circuit 110.

Figure 6:
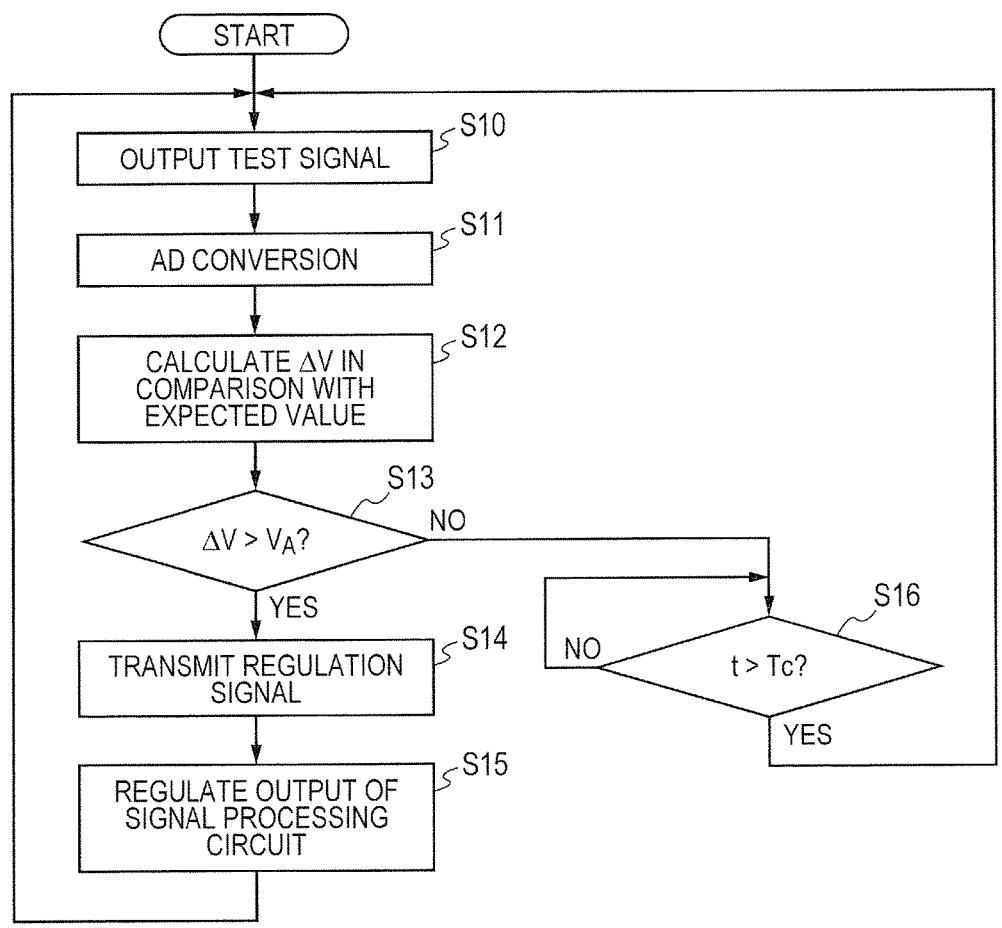
FIG. 6 is a flowchart showing the signal processing system according to the second embodiment.

A Signal Processing Method of the Signal Processing System According to the Second Embodiment Referring to FIG. 6, the signal processing method of the signal processing system 300 or the signal processing system 301 according to the second embodiment will be described below. FIG. 6 is a flowchart showing the signal processing system according to the second embodiment.

First, the first semiconductor device 100 outputs the test signal 131 (step S10). In the modification of the second embodiment, the multiplexer 130 can select the second processing signal 127 from the input signals as the test signal 131 or select the reference voltage 112.

Then, the AD converter circuit 210 of the second semiconductor device 200 converts the received test signal 131 to the digital signal 211 (step S11). The AD converter circuit 210 outputs the digital signal 211 to the test circuit 220.

The test circuit 220 of the second semiconductor device 200 then compares the inputted digital signal 211 and a stored expected value and calculates a difference value ΔV as a comparison result (step S12).

Subsequently, the test circuit 220 decides whether or not the difference value ΔV is larger than a predetermined value $V_A$ (step S13).

If the digital signal 211 obtained by AD-converting the test signal 131 is set within a predetermined range, the test circuit 220 does not decide that the difference value ΔV is larger than the predetermined value $V_A$ (step S13: No). In this case, the output of the analog signal processing circuit 120 does not need to be regulated. In other words, the test circuit 220 does not output the regulation signal 141. In this case, the test circuit 220 monitors the timer 240 and decides whether or not an elapsed time t counted by the timer 240 has reached a predetermined time Tc (step S16). The predetermined time Tc is a time during which the characteristics of the semiconductor device may be changed by, for example, aged deterioration. Specifically, the time Tc may be set at, for example, 100 hours, 500 hours, or 1000 hours.

If the test circuit 220 does not decide that the elapsed time t counted by the timer 240 has reached the predetermined time Tc (step S16: No), the test circuit 220 repeatedly decides whether or not an elapsed time counted by the timer 240 has reached the time Tc (step S16). If the test circuit 220 decides that the elapsed time t counted by the timer 240 has reached the predetermined time Tc (step S16: Yes), the signal processing system 300 returns to step S10 and the first semiconductor device 100 outputs the test signal 131 again (step S10).

The explanation will be continued from step S13. If the digital signal 211 obtained by AD-converting the test signal 131 deviates from the predetermined range, the test circuit 220 decides that the difference value ΔV is larger than the predetermined value $V_A$ (step S13: Yes). In this case, the test circuit 220 generates the regulation signal 141 corresponding to the difference value ΔV. The test circuit 220 generates the regulation signal 141 corresponding to the difference value ΔV and outputs the regulation signal 141 to the SPI communication section 230 (step S14). The SPI communication section 230 receives the regulation signal 141 outputted from the test circuit 220 and outputs the signal to the regulator circuit 150 through the SPI communication section 140.

Then, the regulator circuit 150 regulates the output of the analog signal processing circuit 120, in response to the received regulation signal 141 (step S15). In the signal processing system 300 of FIG. 4, the regulation of the output of the analog signal processing circuit 120 is to regulate the output of the analog signal processing circuit 120 by means of the regulator circuit 150. In the signal processing system 301 of FIG. 5, the regulation of the output of the analog signal processing circuit 120 is to regulate the output of the reference voltage generation circuit 110 by means of the regulator circuit 150.

When the regulator circuit 150 regulates the output of the analog signal processing circuit 120, the first semiconductor device 100 or the first semiconductor device 101 outputs the regulated test signal 131 (step S10). Subsequently, if the difference value ΔV is larger than the predetermined value $V_A$, the signal processing system 300 repeatedly regulates the output of the analog signal processing circuit 120 through the regulator circuit 150, repeatedly outputs the test signal 131 through the multiplexer 130, repeatedly converts the test signal into the digital signal 211 through the AD converter circuit 210, and repeatedly compares the digital signal 211 and the expected value through the test circuit 220 until the difference value ΔV falls below the predetermined value $V_A$.

Through the signal processing, the signal processing system 300 suppresses the influence of noise generated by the internal circuit of the semiconductor device 100 and regulates a change of characteristics in the event of aged deterioration of the analog signal processing circuit 120.

In the modification of the second embodiment, the multiplexer 130 can select the test signal 131 in step S10 as follows: the multiplexer 130 first selects the reference voltage 112 as the test signal 131 and outputs the signal. Then, the signal processing system 301 performs the processing of steps S10 to S15. If the process returns to step S10 after step S15, the multiplexer 130 can select the second processing signal 127 as the test signal 131 and output the signal.

Third Embodiment

Figure 7:
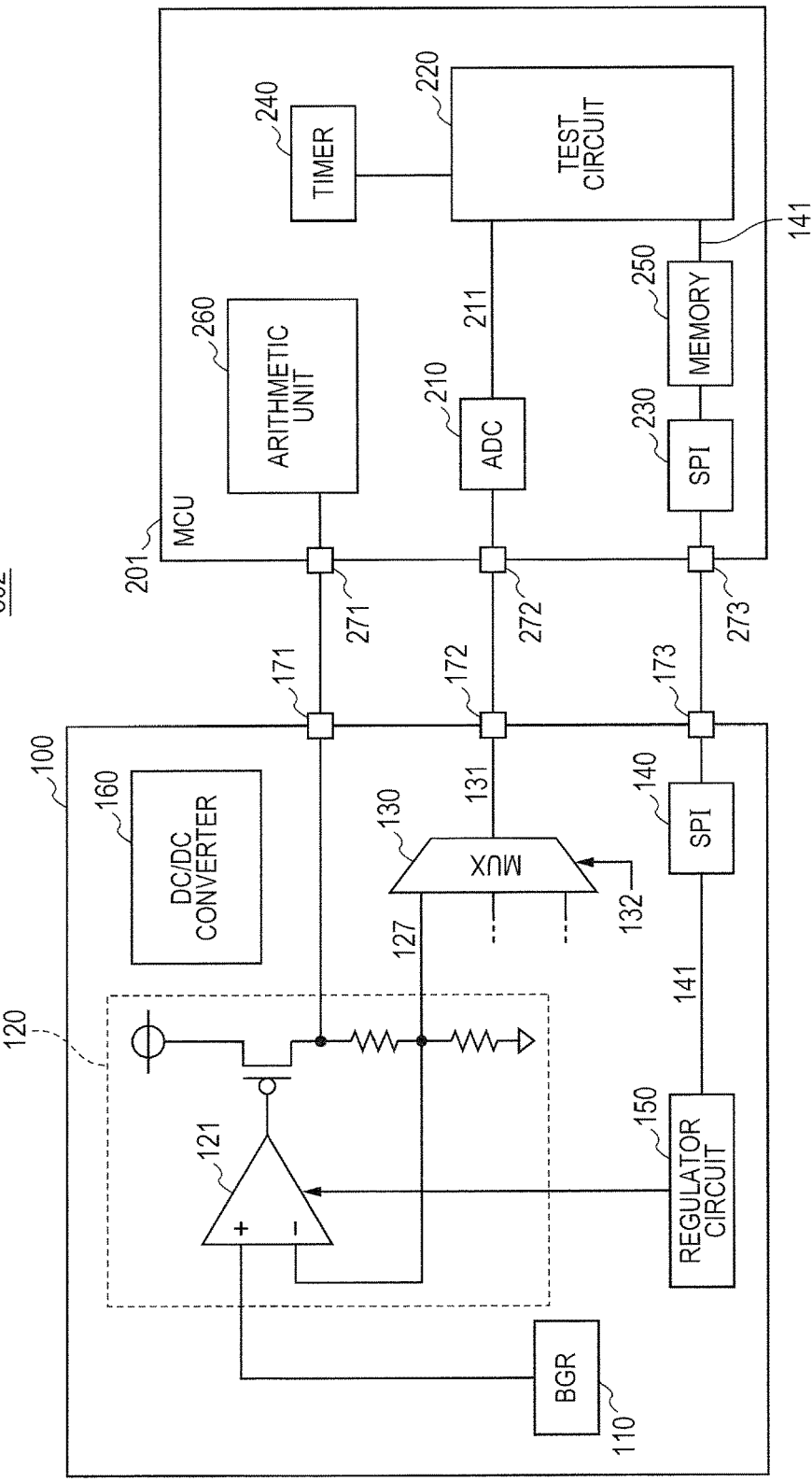
FIG. 7 is a block diagram showing a signal processing system according to a third embodiment.

Referring to FIG. 7, a third embodiment will be described below. FIG. 7 is a block diagram showing a signal processing system according to the third embodiment. A signal processing system 302 in FIG. 7 is different from the semiconductor device 300 in FIG. 4 in that a second semiconductor device 201 is provided instead of the second semiconductor device 200. The second semiconductor device 201 includes a memory 250 between a test circuit 220 and an SPI communication section 230.

The memory 250 stores a regulation signal 141 outputted from the test circuit 220. The memory 250 is a rewritable and nonvolatile memory section that includes, for example, flash memory, electrically erasable programmable read-only memory (EEPROM), and magnetic random access memory (MRAM). Since the memory 250 is a nonvolatile memory section, the regulation signal 141 can be stored even after the signal processing system 302 stops the system. Thus, if the system is stopped and restarted, a regulator circuit 150 can read the regulation signal 141 stored in the memory 250. Then, the regulator circuit 150 may regulate an analog signal processing circuit 120 in response to the read regulation signal 141. With this configuration, the signal processing system 302 can regulate the analog signal processing circuit 120 in response to the stored regulation signal 141 at the start of the system.

Modification of the Third Embodiment

Figure 8:
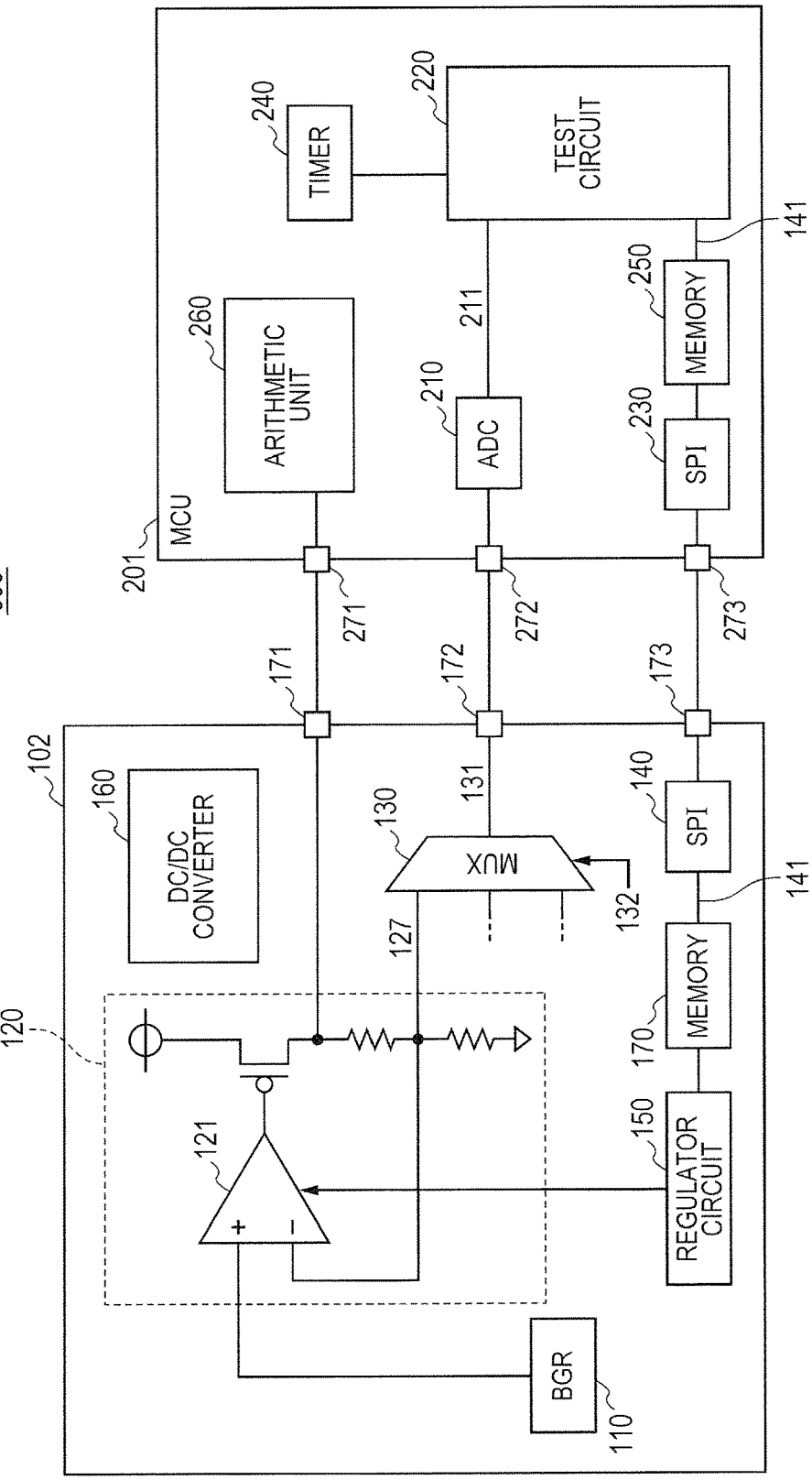
FIG. 8 is a block diagram showing a modification of the signal processing system according to the third embodiment.

Referring to FIG. 8, the modification of the third embodiment will be described below. FIG. 8 is a block diagram showing the modification of the signal processing system according to the third embodiment. A signal processing system 303 in FIG. 8 is different from the signal processing system 300 in FIG. 7 in that a first semiconductor device 102 is provided instead of the first semiconductor device 100. The first semiconductor device 102 is identical in configuration to the second modification illustrated with reference to FIG. 3 according to the first embodiment. Specifically, the signal processing system 303 in FIG. 7 includes a memory 170 in the first semiconductor device 102 and the memory 250 in the second semiconductor device 201.

With this configuration, the first semiconductor device 100 outputs a test signal to the second semiconductor device 200. Then, the second semiconductor device 200 stores the regulation signal 141 for regulating the analog signal processing circuit, in the memory 250 and the memory 170. The first semiconductor device regulates the output of the analog signal processing circuit 120 in response to the regulation signal 141 stored in the memory 250 or the memory 170. The signal processing system 303 can suppress a data loss by storing the regulation signal 141 in the memory 250 and the memory 170.

Obviously, a signal processing system including the first semiconductor device 102 and the second semiconductor device 200 is also applicable as another modification. The signal processing system can regulate the analog signal processing circuit 120 by using the regulation signal stored in the memory 170 included in the first semiconductor device 102. With this configuration, the signal processing system can regulate the analog signal processing circuit 120 in response to the stored regulation signal at the start of the system. Thus, the system can be started in a short time.

In the first semiconductor device 102, the regulator circuit 150 is coupled to the analog signal processing circuit 120. The regulator circuit 150 may be coupled to the reference voltage generation circuit 110 and regulate the reference voltage.

Figure 9:
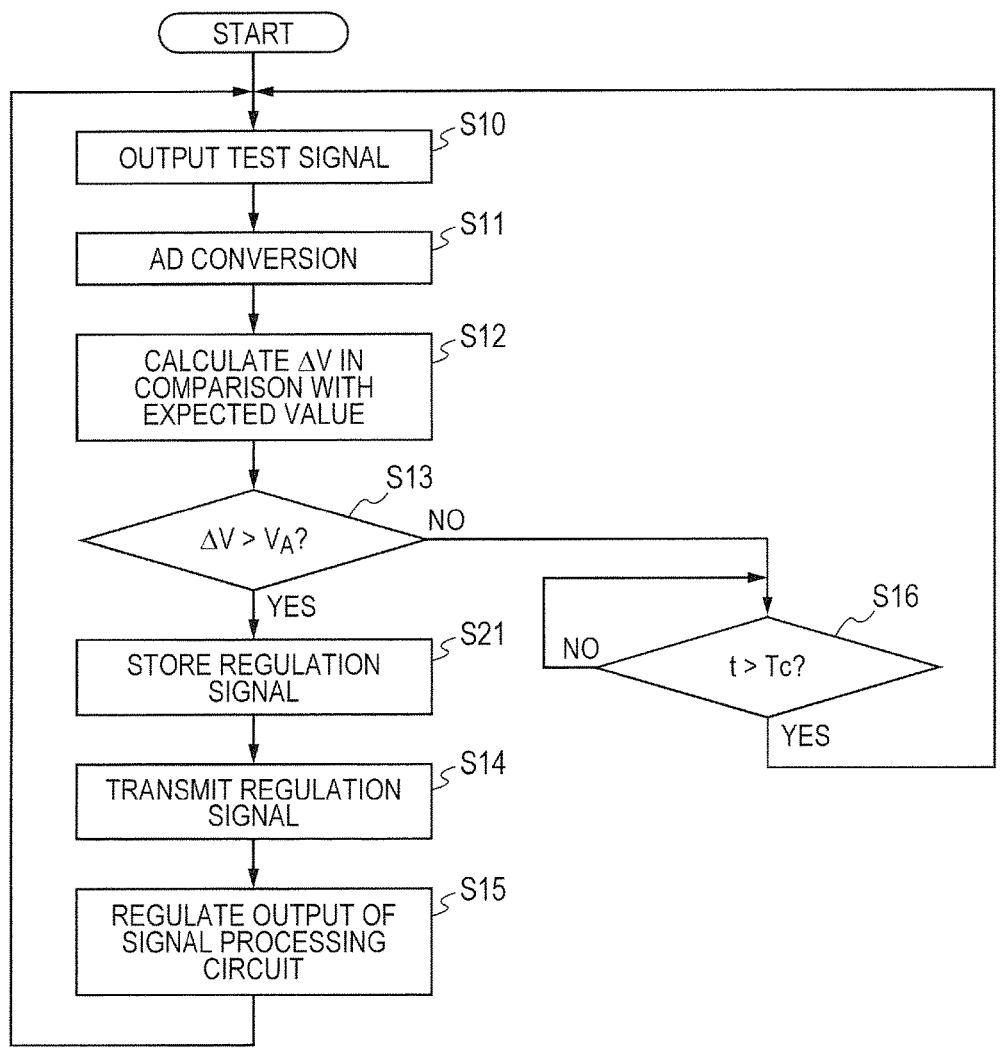
FIG. 9 is a flowchart showing the signal processing system according to the third embodiment.

A Signal Processing Method of the Signal Processing System According to the Third Embodiment Referring to FIG. 9, the processing of the signal processing system 302 according to the third embodiment will be described below. FIG. 9 is a flowchart showing the signal processing system according to the third embodiment. The flowchart of FIG. 9 is different from that of FIG. 6 in that step S21 is interposed between step S13 and step S14. Differences from the flowchart of FIG. 6 will be discussed below.

In the flowchart of FIG. 9, if the digital signal 211 obtained by AD-converting the test signal 131 deviates from the predetermined range, the test circuit 220 decides that the difference value ΔV is larger than the predetermined value $V_A$ (step S13: Yes). In this case, the test circuit 220 generates the regulation signal 141 corresponding to the difference value ΔV. The test circuit 220 generates the regulation signal 141 corresponding to the difference value ΔV and outputs the regulation signal 141 to the memory 250. The memory 250 stores the regulation signal 141 outputted from the test circuit 220 (step S21).

Then, the memory 250 outputs the stored regulation signal 141 to the SPI communication section 230 (step S14). The SPI communication section 230 receives the regulation signal 141 outputted from the memory 250 and outputs the signal to the regulator circuit 150 through the SPI communication section 140. Subsequent processing is similar to the flowchart of FIG. 6.

Through the signal processing, the signal processing system 300 suppresses the influence of noise generated by the internal circuit of the semiconductor device 100 and regulates a change of characteristics in the event of aged deterioration of the analog signal processing circuit 120. Since the memory stores the regulation signal 141, the regulator circuit 150 can read the regulation signal 141 stored at the start of the system.

Signal processing is similarly performed also in the signal processing system 303. In the signal processing of the signal processing system 303, the test circuit 220 can output the regulation signal 141 to both of the memory 250 and the memory 170. Moreover, the regulator circuit 150 can receive the regulation signal 141 from at least one of the memory 250 and the memory 170. However, if the signal processing system 303 is started, the starting time can be shortened in the absence of SPI communications. Thus, in this case, the regulation signal from the regulator circuit 150 is more preferably received by the memory 170.

With this configuration, the signal processing system 302 and the signal processing system 303 suppress a data loss by storing the regulation signal in the memory 250 or the memory 170; meanwhile, the signal processing systems suppress the influence of noise generated by the internal circuit of the semiconductor device 100 and regulates a change of characteristics in the event of aged deterioration of the analog signal processing circuit 120.

The invention made by the present inventors was specifically described in accordance with the foregoing embodiments. Obviously, the present invention is not limited to the embodiments and various changes can be made within the scope of the invention.

At least a part of the embodiments may be described as in the following notes but is not limited thereto.

(Note 1)

A semiconductor device including:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal; and
a regulator circuit that regulates the output of the analog signal processing circuit in response to the regulation signal.

(Note 2)

The semiconductor device according to note 1,
in which the analog signal processing circuit is a circuit including an amplifier, and
the regulator circuit regulates the voltage of an input signal to the amplifier.

(Note 3)

The semiconductor device according to note 1,
in which the regulator circuit regulates the output of the analog signal processing circuit by regulating the reference voltage.

(Note 4)

The semiconductor device according to note 3,
in which the test signal output section outputs, as the test signal, one of the second processing signal and the reference voltage.

(Note 5)

The semiconductor device according to note 1,
in which the test signal output section receives an instruction for outputting the test signal from the outside and then outputs the test signal in response to the instruction.

(Note 6)

The semiconductor device according to note 1, further including an instruction section that instructs the test signal output section to output the test signal if the driving time of the analog signal processing circuit reaches a predetermined time.

(Note 7)

The semiconductor device according to note 1, further including a memory section for storing the regulation signal, the regulator circuit regulating the output of the analog signal processing circuit in response to the regulation signal stored in the memory section.

(Note 8)

The semiconductor device according to note 1, further including a switching circuit that repeatedly performs a switching operation.

(Note 9)

A signal processing system including:
a first semiconductor device including: a reference voltage generation circuit that generates a reference voltage; an analog signal processing circuit that outputs a first processing signal according to the reference voltage; a test signal output section that outputs, as a test signal, a second processing signal having a lower voltage than the first processing signal; an input section that receives a regulation signal for the outputted test signal; and a regulator circuit that regulates the output of the analog signal processing circuit in response to the regulation signal, and
a second semiconductor device including: an AD converter circuit that converts, into a digital signal, the test signal outputted from the first semiconductor device and then outputs the digital signal, and a test circuit that compares the digital signal and a stored expected value and then outputs the regulation signal according to a difference value obtained as a comparison result.

(Note 10)

The signal processing system according to note 9,
in which the analog signal processing circuit is a circuit including an amplifier, and
the regulator circuit regulates the voltage of an input signal to the amplifier.

(Note 11)

The signal processing system according to note 9,
in which the regulator circuit regulates the output of the analog signal processing circuit by regulating the reference voltage.

(Note 12)

The signal processing system according to note 11,
in which the test signal output section outputs, as the test signal, one of the second processing signal and the reference voltage.

(Note 13)

The signal processing system according to note 9, in which if the driving time of the analog signal processing circuit reaches a predetermined time, the test signal output section outputs the test signal, the AD converter circuit converts the test signal into the digital signal and outputs the digital signal, the test circuit compares the digital signal and the expected value and outputs the regulation signal, and the regulator circuit regulates the output of the analog signal processing circuit in response to the regulation signal.

(Note 14)

The signal processing system according to note 9,
in which if the difference value is larger than a predetermined value, until the difference value falls below the predetermined value, the regulator circuit repeatedly regulates the output of the analog signal processing circuit, the test signal output section repeatedly outputs the test signal, the AD converter circuit repeatedly converts the test signal into the digital signal and outputs the digital signal, and the test circuit repeatedly compares the digital signal and the expected value.

(Note 15)

The signal processing system according to note 9,
in which the second semiconductor device further includes a memory section for storing the regulation signal to be outputted to the first semiconductor device.

(Note 16)

The signal processing system according to note 9,
in which the first semiconductor device further includes a memory section for storing the regulation signal to be outputted to the regulator circuit.

(Note 17)

The signal processing system according to note 9, in which the first semiconductor device further includes a memory section for storing the regulation signal to be outputted to the regulator circuit, and the second semiconductor device further includes a memory section for storing the regulation signal to be outputted to the first semiconductor device.

(Note 18)

The signal processing system according to note 9, in which the first semiconductor device further includes a switching circuit that repeatedly performs a switching operation.

(Note 19)

A signal processing method including the steps of:

generating a reference voltage by a first semiconductor device;

outputting a first processing signal as the output of an analog signal processing circuit according to the reference voltage by the first semiconductor device;

outputting a second processing signal having a lower voltage than the first processing signal, as a test signal by the first semiconductor device;

converting the test signal into a digital signal and then outputting the digital signal by a second semiconductor device;

comparing the digital signal and a stored expected value and then outputting a regulation signal by a second semiconductor device according to a difference value obtained as a comparison result;

receiving the regulation signal by the first semiconductor device; and regulating the output of the analog signal processing circuit by the first semiconductor device in response to the regulation signal.

(Note 20)

The signal processing method according to note 19, in which the analog signal processing circuit is a circuit including an amplifier, and the voltage of an input signal to the amplifier is regulated in the step of regulating the output of the analog signal processing circuit.

(Note 21)

The signal processing method according to note 19, in which the step of regulating the output of the analog signal processing circuit is performed by changing the reference voltage.

(Note 22)

The signal processing method according to note 21, in which the first semiconductor device outputs one of the second processing signal and the reference voltage as the test signal.

(Note 23)

The signal processing method according to note 19, in which if the driving time of the first semiconductor device reaches a predetermined time, the test signal is outputted, the digital signal is converted and outputted, the digital signal and the expected value are compared with each other, the regulation signal is outputted according to a difference value obtained as a comparison result, and the output of the analog signal processing circuit is regulated.

(Note 24)

The signal processing method according to note 19, in which if the difference value is larger than a predetermined value, until the difference value falls below the predetermined value, the output of the analog signal processing circuit is repeatedly regulated, the test signal is repeatedly outputted, the digital signal is repeatedly converted and outputted, and the digital signal and the expected value are repeatedly compared with each other.

(Note 25)

The signal processing method according to note 19, further including the step of causing the second semiconductor device to store the regulation signal to be outputted to the first semiconductor device.

(Note 26)

The signal processing method according to note 19, further including the step of causing the first semiconductor device to store the regulation signal to be outputted to the regulator circuit.

(Note 27)

The signal processing method according to note 19, further including the step of causing the first semiconductor device to store the regulation signal to be outputted to the regulator circuit, and the step of causing the second semiconductor device to store the regulation signal to be outputted to the first semiconductor device.

(Note 28)

The signal processing method according to note 19, in which the first semiconductor device repeatedly performs a switching operation.

What is claimed is:

1. A semiconductor device comprising:
   a reference voltage generation circuit that generates a reference voltage;
   an analog signal processing circuit that outputs a first processing signal according to the reference voltage;
   a test signal output section that outputs, as a test signal, a second processing signal having a lower voltage than the first processing signal;
   an input section that receives a regulation signal for the outputted test signal; and
   a regulator circuit that regulates an output of the analog signal processing circuit in response to the regulation signal,
   wherein the test signal output section outputs, as the test signal, one of the second processing signal and the reference voltage.

2. The semiconductor device according to claim 1,
   wherein the analog signal processing circuit is a circuit including an amplifier, and
   wherein the regulator circuit regulates a voltage of an input signal to the amplifier.

3. The semiconductor device according to claim 1,
   wherein the regulator circuit regulates the output of the analog signal processing circuit by regulating the reference voltage.

4. A semiconductor device comprising:
   a reference voltage generation circuit that generates a reference voltage;
   an analog signal processing circuit that outputs a first processing signal according to the reference voltage;
   a test signal output section that outputs, as a test signal, a second processing signal having a lower voltage than the first processing signal;
   an input section that receives a regulation signal for the outputted test signal, and
   a regulator circuit that regulates an output of the analog signal processing circuit in response to the regulation signal, wherein the test signal output section receives an instruction for outputting the test signal from outside and then outputs the test signal in response to the instruction.

5. A semiconductor device comprising:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal;
a regulator circuit that regulates an output of the analog signal processing circuit in response to the regulation signal; and
an instruction section that instructs the test signal output section to output the test signal if a driving time of the analog signal processing circuit reaches a predetermined time.

6. A semiconductor device comprising:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal;
a regulator circuit that regulates an output of the analog signal processing circuit in response to the regulation signal; and
a memory section for storing the regulation signal,
the regulator circuit regulating the output of the analog signal processing circuit in response to the regulation signal stored in the memory section.

7. A semiconductor device comprising:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal;
a regulator circuit that regulates an output of the analog signal processing circuit in response to the regulation signal; and
a switching circuit that repeatedly performs a switching operation.

8. A signal processing system comprising:
a first semiconductor device including:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal; and
a regulator circuit that regulates an output of the analog signal processing circuit in response to the regulation signal; and a second semiconductor device including:
an AD converter circuit that converts, into a digital signal, the test signal outputted from the first semiconductor device and then outputs the digital signal; and
a test circuit that compares the digital signal and a stored expected value and then outputs the regulation signal according to a difference value obtained as a comparison result,
wherein the test signal output section outputs, as the test signal, one of the second processing signal and the reference voltage.

9. The signal processing system according to claim 8,
wherein the analog signal processing circuit is a circuit including an amplifier, and
wherein the regulator circuit regulates a voltage of an input signal to the amplifier.

10. The signal processing system according to claim 8,
wherein the regulator circuit regulates the output of the analog signal processing circuit by regulating the reference voltage.

11. A signal processing system comprising:
a first semiconductor device including:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal; and
a regulator circuit that regulates an output of the analog signal processing circuit in response to the regulation signal; and
a second semiconductor device including:
an AD converter circuit that converts, into a digital signal, the test signal outputted from the first semiconductor device and then outputs the digital signal; and
a test circuit that compares the digital signal and a stored expected value and then outputs the regulation signal according to a difference value obtained as a comparison result,
wherein if a driving time of the analog signal processing circuit reaches a predetermined time, the test signal output section outputs the test signal, the AD converter circuit converts the test signal into the digital signal and outputs the digital signal, the test circuit compares the digital signal and the expected value and outputs the regulation signal, and the regulator circuit regulates the output of the analog signal processing circuit in response to the regulation signal.

12. A signal processing system comprising:
a first semiconductor device including:
a reference voltage generation circuit that generates a reference voltage;
an analog signal processing circuit that outputs a first processing signal according to the reference voltage;
a test signal output section that outputs, as a test signal, a second processing signal having a lower voltage than the first processing signal;
an input section that receives a regulation signal for the outputted test signal; and
a regulator circuit that regulates an output of the analog signal processing circuit in response to the regulation signal; and a second semiconductor device including:
  an AD converter circuit that converts, into a digital signal, the test signal outputted from the first semiconductor device and then outputs the digital signal; and
  a test circuit that compares the digital signal and a stored expected value and then outputs the regulation signal according to a difference value obtained as a comparison result,
wherein if the difference value is larger than a predetermined value, until the difference value falls below the predetermined value, the regulator circuit repeatedly regulates the output of the analog signal processing circuit, the test signal output section repeatedly outputs the test signal, the AD converter circuit repeatedly converts the test signal into the digital signal and outputs the digital signal, and the test circuit repeatedly compares the digital signal and the expected value.

13. A signal processing system comprising:
a first semiconductor device including:
  a reference voltage generation circuit that generates a reference voltage;
  an analog signal processing circuit that outputs a first processing signal according to the reference voltage;
  a test signal output section that outputs, as a test signal, a second processing signal having a lower voltage than the first processing signal;
  an input section that receives a regulation signal for the outputted test signal; and
  a regulator circuit that regulates an output of the analog signal processing circuit in response to the regulation signal; and
a second semiconductor device including:
  an AD converter circuit that converts, into a digital signal, the test signal outputted from the first semiconductor device and then outputs the digital signal; and
  a test circuit that compares the digital signal and a stored expected value and then outputs the regulation signal according to a difference value obtained as a comparison result,
wherein the second semiconductor device further includes a memory section for storing the regulation signal to be outputted to the first semiconductor device.

14. A signal processing system comprising:
a first semiconductor device including:
  a reference voltage generation circuit that generates a reference voltage;
  an analog signal processing circuit that outputs a first processing signal according to the reference voltage;
  a test signal output section that outputs, as a test signal, a second processing signal having a lower voltage than the first processing signal;
  an input section that receives a regulation signal for the outputted test signal; and
  a regulator circuit that regulates an output of the analog signal processing circuit in response to the regulation signal; and
a second semiconductor device including:
  an AD converter circuit that converts, into a digital signal, the test signal outputted from the first semiconductor device and then outputs the digital signal; and
  a test circuit that compares the digital signal and a stored expected value and then outputs the regulation signal according to a difference value obtained as a comparison result,
wherein the first semiconductor device further includes a memory section for storing the regulation signal to be outputted to the regulator circuit.

15. A signal processing system comprising:
a first semiconductor device including:
  a reference voltage generation circuit that generates a reference voltage;
  an analog signal processing circuit that outputs a first processing signal according to the reference voltage;
  a test signal output section that outputs, as a teat signal, a second processing signal having a lower voltage than the first processing signal;
  an input section that receives a regulation signal for the outputted test signal; and
  a regulator circuit that regulates an output of the analog signal processing circuit in response to the regulation signal; and
a second semiconductor device including:
  an AD converter circuit that converts, into a digital signal, the test signal outputted from the first semiconductor device and then outputs the digital signal; and
  a test circuit that compares the digital signal and a stored expected value and then outputs the regulation signal according to a difference value obtained as a comparison result,
wherein the first semiconductor device further includes a memory section for storing the regulation signal to be outputted to the regulator circuit, and
wherein the second semiconductor device further includes a memory section for storing the regulation signal to be outputted to the first semiconductor device.

16. A signal processing system comprising:
a first semiconductor device including:
  a reference voltage generation circuit that generates a reference voltage;
  an analog signal processing circuit that outputs a first processing signal according to the reference voltage;
  a test signal output section that outputs, as a test signal, a second processing signal having a lower voltage than the first processing signal;
  an input section that receives a regulation signal for the outputted test signal; and
  a regulator circuit that regulates an output of the analog signal processing circuit in response to the regulation signal; and
a second semiconductor device including:
  an AD converter circuit that converts, into a digital signal, the test signal outputted from the first semiconductor device and then outputs the digital signal; and
  a test circuit that compares the digital signal and a stored expected value and then outputs the regulation signal according to a difference value obtained as a comparison result,
wherein the first semiconductor device further includes a switching circuit that repeatedly performs a switching operation.

17. A signal processing method comprising the steps of:
generating a reference voltage by a first semiconductor device;
outputting a first processing signal as an output of an analog signal processing circuit according to the reference voltage by the first semiconductor device;
outputting a second processing signal having a lower voltage than the first processing signal, as a test signal by the first semiconductor device;

converting the test signal into a digital signal and then outputting the digital signal by a second semiconductor device;

comparing the digital signal and a stored expected value and then outputting a regulation signal by a second semiconductor device according to a difference value obtained as a comparison result;

receiving the regulation signal by the first semiconductor device; and regulating the output of the analog signal processing circuit by the first semiconductor device in response to the regulation signal.

18. The signal processing method according to claim 17, wherein the analog signal processing circuit is a circuit including an amplifier, and wherein a voltage of an input signal to the amplifier is regulated in the step of regulating the output of the analog signal processing circuit.

* * * * *